United States Patent
Rossetti

(10) Patent No.: US 10,188,007 B2
(45) Date of Patent: Jan. 22, 2019

(54) OPTICAL UNIT FOR AN OPTO-ELECTRONIC SYSTEM

(71) Applicant: Datalogic IP Tech S.r.l., Lippo di Calderara di Reno (IT)

(72) Inventor: Luca Rossetti, Bologna (IT)

(73) Assignee: Datalogic IP Tech S.r.l., Lippo di Calderara di (IT)

( * ) Notice: Subject to any disclaimer, the term of this patent is extended or adjusted under 35 U.S.C. 154(b) by 418 days.

(21) Appl. No.: 14/971,455

(22) Filed: Dec. 16, 2015

(65) Prior Publication Data

US 2016/0174401 A1   Jun. 16, 2016

(30) Foreign Application Priority Data

Dec. 16, 2014   (IT) .............................. MI2014A2154

(51) Int. Cl.
*H05K 5/02* (2006.01)
*G01V 8/10* (2006.01)

(52) U.S. Cl.
CPC ............. *H05K 5/0221* (2013.01); *G01V 8/10* (2013.01)

(58) Field of Classification Search
CPC .. H05K 5/0221; H05K 5/0217; H05K 5/0208; H05K 5/0256; H05K 5/02; G01V 8/10; G01V 8/20
See application file for complete search history.

(56) References Cited

U.S. PATENT DOCUMENTS

| 5,003,169 | A | * | 3/1991 | Sakaguchi | G01V 8/20 250/221 |
| 5,011,325 | A | * | 4/1991 | Antonioli | E01F 15/086 256/13.1 |
| 6,294,777 | B1 | * | 9/2001 | Shteynberg | G01V 8/20 250/221 |
| 6,297,498 | B1 | * | 10/2001 | Shteynberg | G01V 8/20 250/221 |
| 6,750,439 | B2 | * | 6/2004 | Nakazaki | G01V 8/20 250/221 |
| 6,774,352 | B2 | * | 8/2004 | Koyama | G01V 8/20 250/221 |
| 7,122,782 | B2 | * | 10/2006 | Sakaguchi | G01V 8/20 250/222.1 |
| 9,103,931 | B2 | * | 8/2015 | Meinherz | G01V 8/10 |
| 2001/0025918 | A1 | * | 10/2001 | Shteynberg | G01V 8/20 250/221 |

(Continued)

*Primary Examiner* — John Lee
(74) *Attorney, Agent, or Firm* — Shook, Hardy & Bacon, L.L.P.

(57) ABSTRACT

The invention relates to an optical unit for an opto-electronic system, said optical unit comprising: a first and a second opto-electronic component; a casing suitable for containing said first and second opto-electronic component; and a fastening system suitable for connecting together said first and second opto-electronic components, characterized in that said fastening system is fixed to a first end of said first opto-electronic component and to a first end of said second opto-electronic component and comprises: an elastic device movable between an undeformed operative position and a compressed operative position, and a mechanical fastening device suitable for taking said elastic device into said compressed operative position when said mechanical fastening device couples together said first and said second optoelectronic component.

17 Claims, 7 Drawing Sheets

(56) References Cited

U.S. PATENT DOCUMENTS

| | | | | |
|---|---|---|---|---|
| 2001/0040213 A1* | 11/2001 | Shteynberg | ............... | G01V 8/20 |
| | | | | 250/221 |
| 2004/0159778 A1* | 8/2004 | Sakaguchi | ............... | G01V 8/20 |
| | | | | 250/221 |
| 2005/0207724 A1* | 9/2005 | Boeckel | .................... | G01V 8/20 |
| | | | | 385/147 |
| 2006/0068624 A1* | 3/2006 | Boeckel | .................... | G01V 8/20 |
| | | | | 439/159 |
| 2007/0098490 A1* | 5/2007 | Christensen | .......... | E01F 13/022 |
| | | | | 404/6 |
| 2008/0016708 A1* | 1/2008 | Hoermann | ............... | E05F 15/43 |
| | | | | 33/263 |
| 2008/0069632 A1* | 3/2008 | Gosling | ................ | E04B 2/7425 |
| | | | | 403/231 |
| 2009/0001334 A1* | 1/2009 | Christensen | .......... | B29C 49/482 |
| | | | | 256/1 |
| 2014/0374580 A1* | 12/2014 | Ishikawa | ............... | G01J 1/0271 |
| | | | | 250/239 |
| 2016/0174401 A1* | 6/2016 | Rossetti | ............... | H05K 5/0221 |
| | | | | 361/679.01 |

* cited by examiner

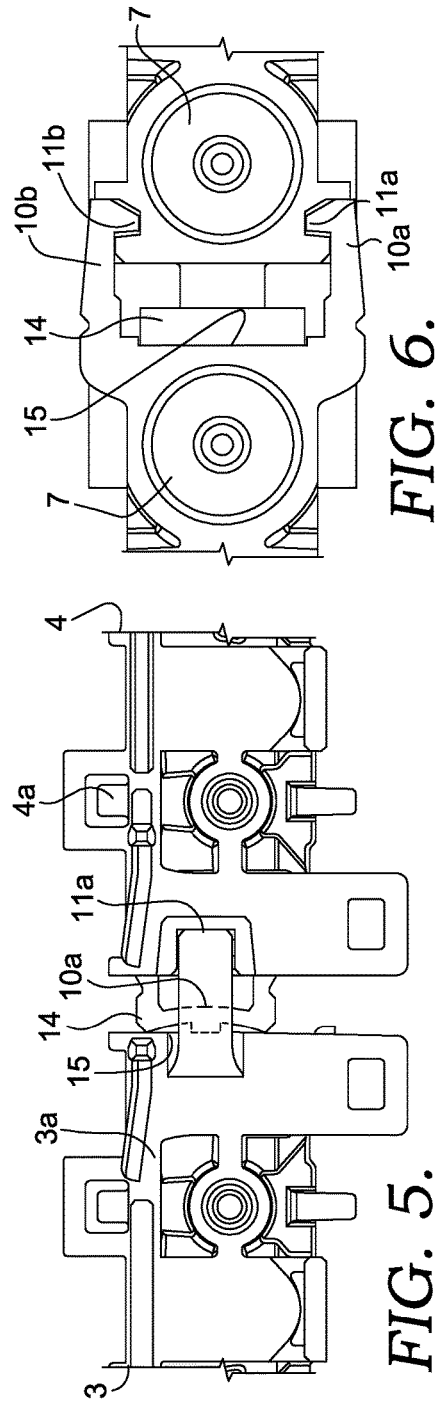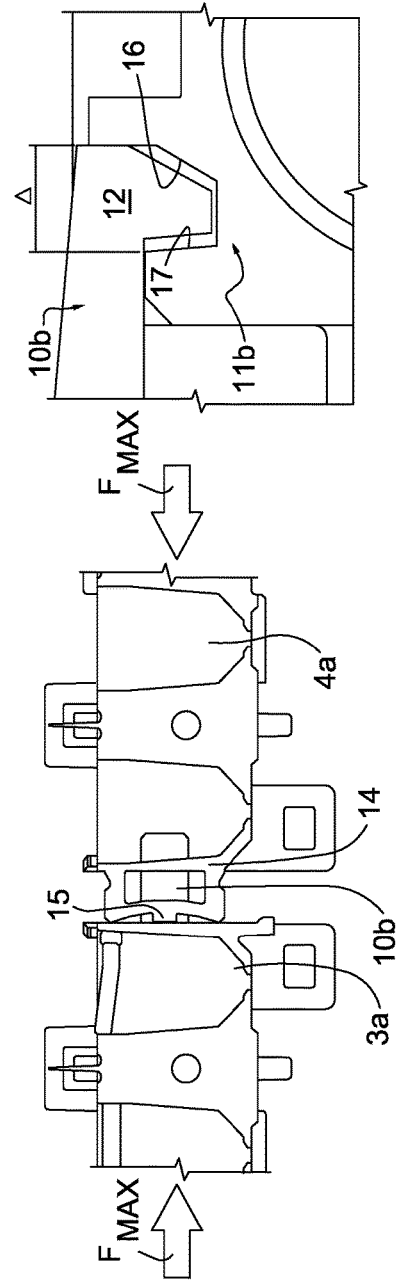

OPTICAL UNIT FOR AN OPTO-ELECTRONIC SYSTEM

CROSS-REFRENCE TO RELATED APPLICATIONS

The application claims priority under 35 U.S.C. § 365 to MI2014A002154, which was filed on Dec. 16, 2014 in Italy. The entirety of the aforementioned application is incorporated by reference herein.

TECHNICAL FIELD

The present invention relates to an optical unit for an opto-electronic system including a plurality of opto-electronic components fastened together and placed within a casing. The fastening system, suitable for connecting two opto-electronic components of the plurality, allows for easy attachment while at the same time minimizes the undesirable effects arising from the play caused by the tolerances present within the different components and/or casing.

BACKGROUND

It is known to have a plurality of opto-electronic components within a casing, whose components are generally attached thereto in order to produce a particular device or optical unit, such as for use in a photoelectric sensor.

A photoelectric sensor is for example a light barrier, generally known in regard to the safety on the workplace. The barriers generally emit one or more light beams and are usually called light grid or light barrier.

Certain types of light barrier are utilized to detect movement or the intrusion of a foreign body within a zone, such as for example a machinery operating zone, and can guarantee the protection of the operators working with the machinery or other industrial equipment. Other light barriers are constructed in order to control automated industrial processes and are used to verify the assembly process by counting the objects, recognizing the products being transported for example on a conveyor belt, recognizing irregular shapes, etc. Numerous other applications are envisaged.

In general light barriers include two optical units, often called "bars"; one of the two units is the emitter while the other is the receiver. The two optical units can be coupled together; that is to say the same bar can include both the emitter and the receiver. For example, the same optical unit can include light emitters and light receivers.

Light barriers generally utilize emitters that produce either visible spectrum or infrared light sources as the emitter. For example, said sources can include light emitting diodes (LED) mounted at a distance from each other along a transmitter bar that can be placed for example on one side of the monitored zone; photo-transistors, photo-diodes, or other photo-receivers can be used as the receiving elements, which can be mounted for example along a receiver bar on the opposite side of the monitored zone.

In a known example of the operation of a light barrier represented in FIG. 1b, the light sources within the emitter light grid TX emit beams of light towards the photo-receptors of the receiver bar RX. If one or more beams is blocked by an opaque object, such as the arm of an operator (indicated by a circle in FIG. 1b), a control circuit—not illustrated—stops the operating machine that the operator is in charge of, preventing the machine from continuing with the work or otherwise protecting the area and the operator.

As stated above, this interruption can also be utilized to count objects or verify the entrance of goods into a particular zone.

Each light barrier therefore employs a plurality of emitters, as well as a plurality of receivers, and the number of emitters and/or receivers of the plurality depends upon the specific application of the barrier. Emitters and/or receivers are generally assembled together such as to form "arrays" including a number n of emitters and/or receivers spaced apart from the other. The distance between an emitter and a receiver closest to it or between an emitter and receiver closest to it—in other words the pitch of the array—determines the resolution of the light barrier itself.

Each array usually includes a body, commonly molded out of a plastic material, in which n optical chambers are spaced apart and rigidly fixed, within which the optical unit that forms the emitter or receiver is mounted. Additionally these chambers include an opening for the emission or reception of the light signal. These chambers are attached to each other in series side by side such as to form a row of n chambers.

In order to give the desired flexibility as regards the number of emitters and receivers to be used depending upon the type of application, multiple arrays can be combined with each other and then encased within a container or casing that contains, in addition to the arrays, other devices such as an electronic mother board, the power supply, a processing unit, etc. The system of "n" consecutively coupled arrays is always subjected to a compression force produced by the support forces of the container start and end mechanical stops, within which container the arrays are protected: this compression force is variable in that it depends upon the dimensional tolerance of the container itself and the "sum" of the dimensional tolerances of the optical arrays. In other words, the larger the number of arrays coupled together, the greater the dimensional tolerances in play.

It is therefore felt that there is a need to be able to recover the inevitable "play" due to such tolerances. The presence of play in fact causes an incorrect response of the barrier to vibrations or movements, which cause the displacement of one array with respect to the others. Additionally, the presence of play means that the distance between a final optical chamber of an array and an initial optical chamber of the adjacent array are not set apart by a distance that is comparable to the pitch of the optical chambers within a single array. This leads to a change in the resolution of the light barrier. It is in fact desirable that the pitch of consecutive optics be as close as possible to the ideal value that would be obtained if there were not different arrays composing the entire product but rather if it were composed of a single item in order to maintain the degree of resolution equal to the "nominal" resolution value.

In the German patent DE 10 2009 021 645 in the name of Sick AG a light barrier is described comprising at least one array of emitters or receivers. Two receivers or emitters of the array are mutually separated by a flexible separator element.

In the product of the same Applicant referred to as "SG4 extended", more arrays are mutually coupled together by means of a mechanical coupling and an elastic element is interposed between the casing and the end of the array that it is in contact with it.

BRIEF SUMMARY

The main object of the present invention is to minimize and/or recover the play that is present within an optical unit for an opto-electronic system including at least a first and a second opto-electronic component, such as a first and a second array of emitters and/or receivers and a casing containing the same, and the problems found in connection thereto as discussed in the presentation of the prior art.

Such a minimization according to the invention does not require the construction of special additional components, or in any case any additional components are low cost and simple to produce.

According to one aspect, the invention relates to an optical unit for an opto-electronic system, said optical unit including:

A first and a second opto-electronic component;
a casing suitable for containing said first and second opto-electronic component; and
a fastening system suitable for connecting together said first and said second opto-electronic components, characterised in that said fastening system is fixed to a first end of said first opto-electronic component and to a first end of said second opto-electronic component and comprises:
an elastic device moveable between an undeformed operative position and a compressed operative position, and
a mechanical fastening device, suitable for taking said elastic device into said compressed operative position when said mechanical fastening device couples together said first and said second opto-electronic component.

The first and the second opto-electronic components are for example the arrays of emitters or receivers of electromagnetic radiation (for example a light signal), such as those used in a light barrier. Other opto-electronic components may however be included in the present invention, for use in any type of opto-electronic system, such as a sensor. Each opto-electronic component may in turn include a plurality of optical chambers which are either the same or different from one another. Preferably each opto-electronic component is designed as a rigid component and is for example preferably comprised of an outer body made of suitably molded plastic. The outer body comprises one or more internal cavities within each of which are placed one or more optical components, each cavity and each optic defining the optical Chamber. The outer body can also define within its interior repetitive "in series" optical chambers that are equal to each other, as in the case of the arrays mentioned above. The geometry of the outer body can take any form, such as substantially box-shaped, but also rounded.

In the case of an array of optical chambers such as receivers or emitters of an electromagnetic radiation signal, the array of optical chambers includes for example a cavity for each chamber, an opening for each chamber for the emission or reception of electromagnetic radiation, an optic for each chamber, etc. These optical chambers for the reception or emission of electromagnetic radiation are known in the technical field of reference and will not therefore be further detailed in the following.

The casing used, within which are placed the opto-electronic components that are fastened together, is basically a protective casing whose shape, size and construction material depend upon the type of use of the opto-electronic system, such as the type of environment within which the optical unit is located. In addition, the dimensions of the case depend upon the number and dimensions of the opto-electronic components. In addition to the first and second opto-electronic components there may be additional components within the casing such as a motherboard, a power supply connector, etc. Additionally, the casing preferably includes a closed window made from a material that is transparent to electromagnetic radiation that may be transmitted or received by the opto-electronic components present within the casing. The first and second opto-electronic components are preferably permanently fixed within the enclosure. Preferably, the motherboard and/or optical boards of the unit are mechanically referenced and blocked by for example joints, screws, riveting, or any combination of these to each optical chamber array.

The first and the second opto-electronic components are connected to each other by means of a fastening system that is suitable for connecting the two components in a reversible manner, i.e. in such a way that the two components can be mutually disconnected without causing damage to the components themselves.

Each opto-electronic component includes a first and a second end. Preferably, each opto-electronic component includes a greater extension dimension than the other two, and therefore the first and second ends are preferably the two axially counterposed ends in the direction of the greatest extension. It is understood, however, that the shape of each opto-electronic component, given by the box-shaped body, can also be completely symmetrical for the rotation and therefore the choice of the first and second ends can be totally arbitrary. Additionally, two ends of one of the lesser dimensions of the opto-electronic component's extension may be chosen.

The fastening system is fixed to a first end of the first opto-electronic component and to a first end of the second opto-electronic component. The fastening system therefore connects the first to the second opto-electronic component by making a connection between the first end of one and the first end of the other. Preferably, in the case where the opto-electronic components define a dominant dimension, the two components are connected together by means of the fastening system in such a way as to be adjacent to each other in series along the dominant direction, referred to as the axial direction.

According to the invention, the fastening system anticipates a "double stage" fastening. A first stage of the fastening includes a mechanical type fastening device, between the ends of the first and second opto-electronic component. A mechanical fastening is a rigid fastening that anticipates the coupling together of a pair of mechanical elements. A second stage of the fastening anticipates an elastic type spring device that renders the fastening elastic itself. The elastic device can be taken from an undeformed operative position, wherein the elastic device is not subjected to any force, provided that this occurs when the first and second components are separated from each other (i.e. in an operative position wherein no coupling is taking place by means of the fastening system), to an operative position in which a force is applied to the elastic device that results in the deformation of said elastic device. It is known that, the greater the force exerted against an elastic device, the greater the force exerted by the elastic device against the deformation force itself.

Each fastening system therefore anticipates a fastening mechanism guaranteed by the mechanical device that mechanically couples the two ends. Also, the elastic device is interposed between the two ends and therefore interferes with the fastening mechanism. The mechanical fastening between the two components results in play that is intrinsic to the production of separate components with given tolerances. However, the inclusion of the elastic device that is "compressed" by the mechanical fastening device whenever two components are coupled together and the force exerted by the elastic device against the compression force guarantee, by means of an appropriate choice of geometric dimensioning, the maintaining of a component that is connected to the next in this pair, elastically recovering the play therein, while maintaining a minimum range of distance between the two consecutive components by being able to vary the compression applied to them, thus being able to adapt the combined size of the two fastened components to different needs.

Therefore, also the distance between optical chambers located at the ends that are fastened to different consecutive components can be maintained within a range that nonetheless guarantees the desired resolution of the opto-electronic system.

Additionally, in the case of more than two opto-electronic components, all of them interconnected in series by means of the fastening system of the invention, the greatest amount of play due to the tolerances existing between all of the components and in relation to the containment casing is nonetheless recoverable and can be compensated for—contrary to the technical note—even more simply than with the coupling of only two components (coupling which generates less play than the coupling of more than two components). In fact, thanks to the presence of multiple elastic devices between the mechanical fastenings, elastic devices that substantially uniformly distribute all of the play between all of the components, the play is better compensated for.

As above, the geometric dimensioning of the fastening mechanism is such that the elastic device, when two components are coupled together, collapses and thus the elastic force due to elastic deformation is generated.

Preferably said mechanical coupling device comprises:
a mechanical element associated with one of said first end of said first opto-electronic component and said first end of said second opto-electronic component, and a mechanical counter-element associated with the other of said first end of said first opto-electronic component and said first end of said second opto-electronic component, said mechanical element and mechanical counter-element being engaged with each other The fastening mechanism therefore consists of two elements, reciprocally mutually fastened, a first component at a first end of one of two opto-electronic components and a second element, also called a counter-element, at the first end of the other of the two opto-electronic components. Both of the first ends of the two coupled opto-electronic components therefore comprise an element of the fastening device.

In a preferred element of embodiment, said mechanical element includes at least one arm. More preferably, it comprises two arms.

Preferably, said mechanical counter element includes at least one seat for receiving at least partially said arm. More preferably it comprises two seats for receiving at least partially two of said arms.

The mechanical fastening therefore takes places by inserting one or two arms, depending on the embodiment example, within one or two seats respectively. The arms are formed at the first end of the first component and the two seats at the first end of the second component, or vice versa. The one or two arms extend starting from the first end of the first (or second) component away from the first (or second) second component substantially in an axial direction. The arm (or both arms) has a preferably hook-shaped terminating part that fits inside the seat formed at the first end of the adjacent component. The fastening is therefore a coupling that prevents axial movements of the two components beyond a certain determined range. That is, with the insertion of the arms within their respective seats, only minimal movements in the axial direction are permitted.

In a similar way to the mechanical fastening, said elastic device preferably includes:
an elastic element associated with one of said first end of said first opto-electronic component and said first end of said second opto-electronic component, and a rigid counter-element associated with the other of said first end of said first opto-electronic component and said first end of said second opto-electronic component, said elastic element abutting against said rigid counter-element.

The elastic device is therefore also formed from two reciprocally mutually abutted elements, a first element of a first end of one of the two opto-electronic components and a second element, also called a counter-element, at the first end of the other of the two opto-electronic components. Both of the first ends of the two components therefore include an element of the elastic device. The elastic element abuts against the rigid element and therefore the distance between the first end of the first component and the first end of the second component determines the compression of the elastic element.

The elastic element protrudes axially from the first end of one of the two components.

The combination of the mechanical fastening and the elastic element therefore makes it possible to maintain a minimum amount of play between the first and second opto-electronic components by means of the mechanical coupling, but takes advantage of the elastic force of the elastic element that is compressed in order to make integral the two components and to compensate for the play itself.

In fact, in closing the distance between the protruding arm or arms of the first end of the first (or second) component and the corresponding seat formed at the first end of the second (or first) component, the elastic element abuts against the rigid element and is gradually compressed. The seat where the terminating part of the arm is inserted is preferably sized in such a way as to enable the positioning of the first and second components at several mutual distances, corresponding to different pressures exerted on the elastic element.

Advantageously, said elastic element is ring shaped and made from plastic material.

Preferably, said rigid counter-element includes an abutment surface for said elastic element, facing and in contact with said elastic element when said first and said second opto-electronic components are connected.

In a preferred embodiment example, said fastening system can be moved through translation between a minimum distance coupled operative position in which the distance between said first end of said first opto-electronic component and said end of said second opto-electronic component coupled together is at a minimum, and a coupled operative position at a maximum distance in which the distance between said first end of said first opto-electronic component and said first end of said second opto-electronic component coupled together is at a maximum.

In other words, the possible distance between the first ends of the first and second opto-electronic components along the axial direction is variable within a certain pre-established range. The variability, i.e. possible axial sliding distance is preferably within a range of +/−0.2 mm from the ideal position in the case of the components in question. In this way it is possible to adapt a plurality of components to different casings or to vary the number of components that are coupled together, in that the overall dimension of the various components connected together can be altered slightly. Thanks to the elastic device, for every distance there is always an elastic force that restricts the reciprocal movement of the components. The greater this elastic force the lesser the distance between the two components in the axial direction, in that the elastic device is compressed between the two ends of the first and second components. Therefore, at a minimum distance, the elastic device compression is at a maximum and the elastic force is at a maximum, at a maximum distance the elastic device compression is at a minimum and the elastic force is at a minimum.

The fastening system can be moved into translation between a first and a second operative attachment position, and these are the so called extreme positions. Between these two operative positions there is a substantially infinite number, in that they are continuous, of intermediate operative fastening positions. The distance between the first end of the first component and the first end of the second component therefore depends upon the actual size and configuration of the casing within which the opto-electronic components are located and upon the number of the same components that are fastened together, since these variables determine the "axial compression" force that is exerted between the components connected together by means of the fastening system and that cause further deformation of the elastic device that is independent of the effect of the mechanical fastening device.

In fact, when the components arranged along an axial direction, one after another when coupled together, are inserted into the casing, the size of the casing itself gives rise to compression in the same axial direction and pushes the two components against one another. The balance between the elastic force of the elastic element from one direction and the compression force exerted by one or more walls of the casing from the other direction determines the positioning of the mechanical fastening, that is, the relative axial positioning of the element and of the mechanical counter-element.

Advantageously, said seat includes a first abutment surface, against which a first surface of said arm is abutted when said fastening system is in said fastening position at its minimum distance. Preferably, this seat includes a second abutment surface, against which a second surface of said arm is abutted when said fastening system is in said fastening position at its maximum distance. More preferably, said first and second abutment surfaces are facing each other and separated by a distance equal to the difference between said minimum and maximum distances.

As previously mentioned, the fastening system can be moved into a continuous number of positions between two extreme positions, the distance between the first end of the first component and the first end of the second component can thus be varied. Preferably this translation takes place in the same direction in which the elastic force of the elastic device acts in the operative compressed condition (axial direction).

The translation is delimited during excursion by the seat within which the mechanical fastening arm is received. When a portion of the arm is inserted into the seat, it remains blocked by a first and a second wall including the said first and said second abutment surfaces, respectively, which prevent sliding beyond that permitted by the distance between the two walls. The arm would be induced to slide by the force exerted by the elastic compression of the elastic element squeezed between the first end of the first component and the first end of the second component in one direction and by the additional compressive force due to the side walls of the casing within which the opto-electronic elements are mounted. Depending upon the balance of forces mentioned above, the end of the arm lies either against one of the two abutment surfaces of the seat, or else in an intermediate position between the two.

The dimensioning of the seat, or the distance between the first and second abutment surfaces is such that within this range, in the case of opto-electronic components such as arrays of emitters and/or receivers of electromagnetic radiation, the final optical chamber at the first end of the first component and the optical chamber at the first end of the second component are "substantially at a distance equal to the pitch" between the optical chambers of the first and second components. The possible translation of the mechanical fastening is therefore limited, it must however be large enough to accommodate the normal tolerances of the components and the casing.

Advantageously, said mechanical element associated with said first end of said first opto-electronic component and said first end of said second opto-electronic component is formed as one piece with said first end and said mechanical counter-element associated with the other said end of said first opto-electronic component and said first end of said second opto-electronic component is formed as one piece with the other first end.

Preferably, said elastic element associated with one of said first ends of said first opto-electronic component and said first end of said second opto-electronic component is formed as one piece with said first end and said rigid counter-element associated with the other of the said first ends of said first opto-electronic component, and said first end of said second opto-electronic component is formed as one piece with said other first end.

In this preferred example, preferably all of the elements making up the fastening system, both mechanical and elastic, are formed as one piece with the respective opto-electronic component. Each opto-electronic component is preferably comprised of a rigid outer body, upon which the first end is defined and within which the optical chambers are formed. Preferably, therefore, the elements of the mechanical and elastic fastening are formed as one piece with the rigid body. Alternatively, only some of the elements of the mechanical and/or elastic fastening are formed as one piece with the rigid body. In this way the total number of pieces constituting the optical unit and the time required for their assembly are minimized. The construction cost for this fastening system is therefore relatively low.

In a preferred embodiment, the first opto-electronic component includes a first and a second end, said first and said second ends both being associated with said mechanical element and with said rigid counter-element, or said first and second ends both being associated with said mechanical counter-element and with said elastic element.

When an opto-electronic component is coupled to other opto-electronic components, it is desirable that the coupling should be reversible, or that it is possible to disassemble the final set of the various components. In the event of disassembly, the mechanical device generally requires different decoupling handling of the component to be removed with respect to the handling required for the decoupling of the elastic element. For example, one type of coupling may require translation in one direction and another type of coupling may require translation in a different direction. It is therefore preferred that each component be removed by means of a single simple movement and so the elastic element and the mechanical element which require distinct movements are therefore positioned on separate components. Each component therefore preferably has the same configuration at both of its ends, that is to say that it presents the same elements of the fastening system at of all of its ends.

Alternatively, said first opto-electronic component includes a first and a second end, said first end being associated with said mechanical element and with said rigid counter-element and said second end including a flat rigid surface suitable for abutting against said casing, or said first end being associated with said counter-mechanical element and with said elastic element and said second end including a flat rigid surface suitable for abutting against said casing.

In the case in which the opto-electronic component is an extreme element, that is, a component which at one end is connected to another opto-electronic component by means of the fastening device and at the other end abuts against a wall of the casing, the end which is in contact with the casing does not have any element of the coupling system present, but a unique, preferably flat, abutment surface. It is not therefore necessary to have additional constructive elements in order to recover any further play.

In a preferred embodiment, said first and/or said second opto-electronic device includes an array of electromagnetic radiation receiving elements or else includes an array of electromagnetic radiation emitting elements.

The arrays can have any number of emitters or receivers.

Preferably said first and/or said second opto-electronic device comprise a body molded from plastic material including said first end.

According to a second aspect, the invention relates to a light barrier including at least one optical unit constructed according to one or more of the features described in relation to the first aspect of the invention.

BRIEF DESCRIPTION OF THE DRAWINGS

These and additional advantages of the invention will become more evident from a detailed description with reference to the enclosed drawings, wherein:

FIGS. 5, 6, 7, 8 are four side views, in different detail, of the first and second opto-electronic components of FIG. 2 in an operative condition at a minimum distance;

DETAILED DESCRIPTION

In the present invention, a light barrier produced according to the present invention is globally indicated with 10. Although in the detailed example, reference is made to a light barrier as an opto-electronic system, this is not to be intended in a limiting sense and other opto-electronic systems may follow on from the teaching of the present invention.

The light barrier 10 according to the invention can be used in any operating environment in which the use of light barriers is known.

The geometry of the light barrier 10 produced according to the invention can be extremely varied, starting from a light barrier 10 including a first and a second optical unit, both indicated with 1, placed one behind the other (see FIG. 1a), the first optical unit 1 including a plurality of emitters and the second a plurality of receivers 1 (analogous to the example of FIG. 1a), as in any other configuration.

Figure 1B:
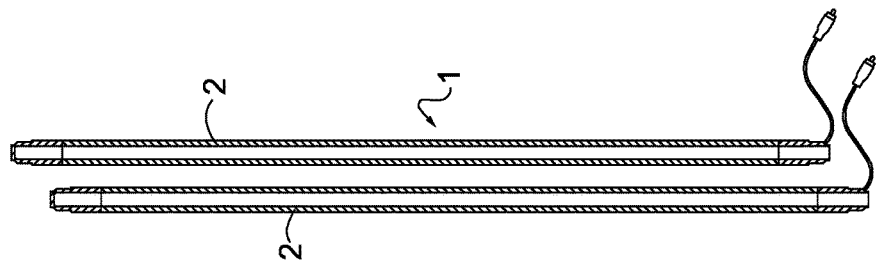
FIG. 1b is a perspective view of an optical unit belonging to a light barrier according to the invention.
Figure 1A:
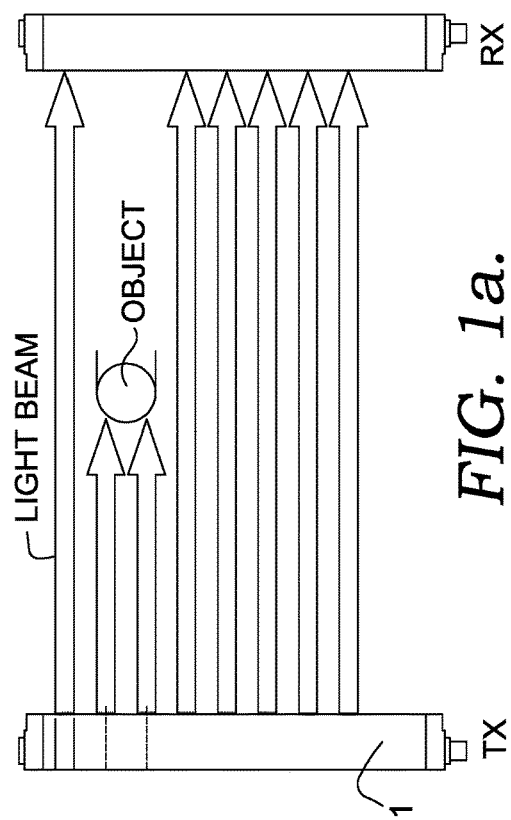
FIG. 1a is a schematic front view of the operating principle of a light barrier embodiment.

The principle of operation of the light barrier 10 has already been described in reference to the drawing of FIG. 1a, applicable to the present embodiment of the invention.

Light barrier 10 includes at least one optical unit 1. The optical unit 1 may be an emitter unit, a receiving unit, or a unit of emission and reception, of electromagnetic radiation.

The optical unit 1 is comprised of an outer casing 2 to protect the optics within. In the preferred example represented in FIG. 1b, said casing is a tube, preferably made of metal. The interior of the metallic tube is hollow in order to house one or more opto-electronic components, such as a plurality of arrays of receivers and/or emitters. The number of arrays present within the optical drive 1 is irrelevant to the present invention and can be arbitrary.

Additionally, each array present within the optical unit is in its internal components, such as optical and sources or receivers, known in the industry and not detailed any further.

Figure 2:
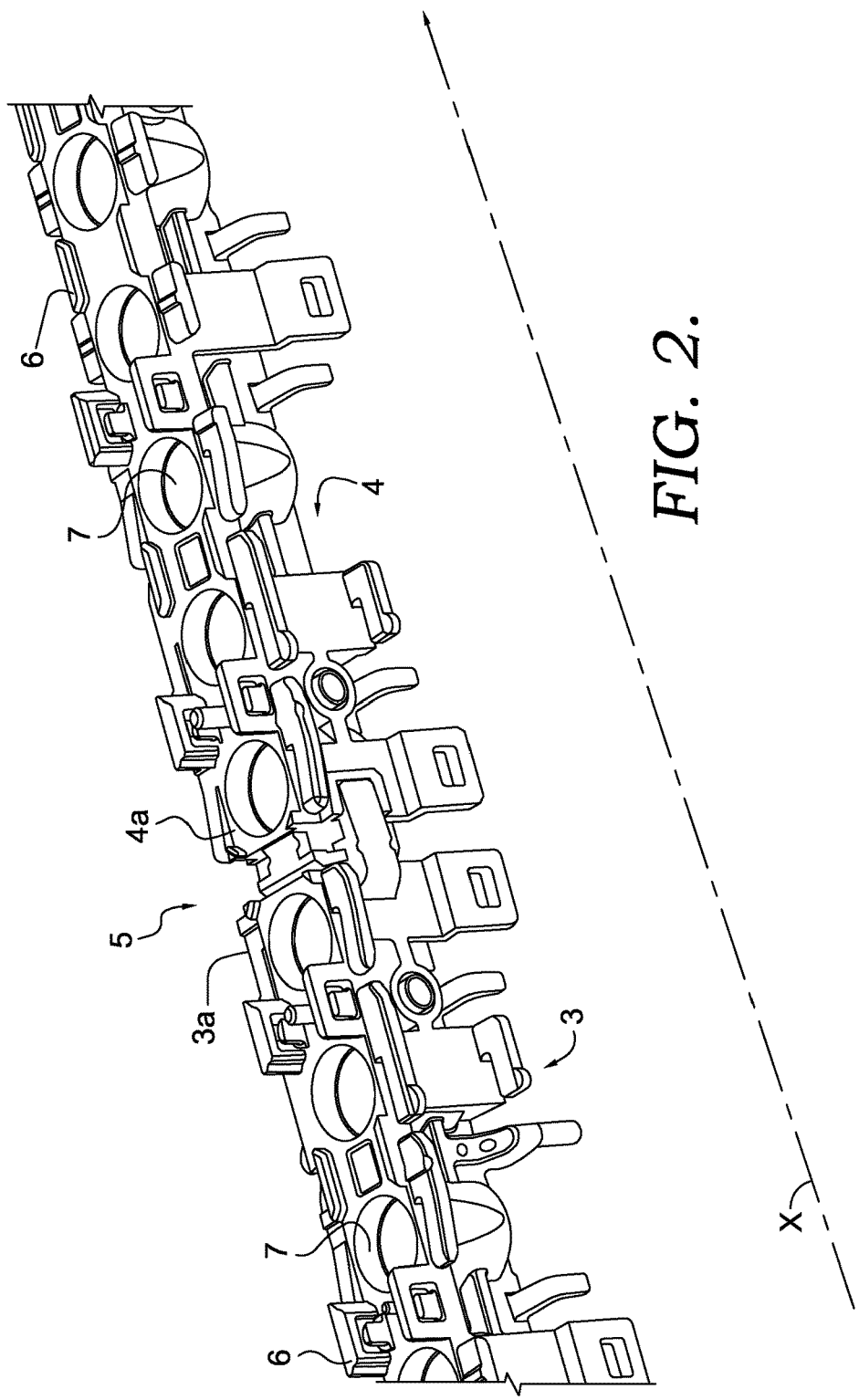
FIG. 2 is a perspective view of a first and a second opto-electronic component coupled to each other and belonging to the optical unit of FIG. 1b.

In FIG. 2, a first and a second array, indicated with 3 and 4, included within the casing 2 of the unit 1 are presented externally to the casing 2. Each array 3, 4 includes a rigid plastic body 6 which is axially elongated and formed as one piece, within which appropriate optical chambers 7 are located. Each optical chamber is uniquely represented as an optical cavity and for clarity the optics within it are not represented. The plastic body 6 defines a first and a second end (not visible in the figures), the first end being referred to as 3a in the array 3 and as 4a in the array 4.

The arrays 3, 4 are mutually coupled via a fastening system 5 corresponding to their first ends 3a, 4a. Both arrays have a dimension which is predominant, their length, and which defines an axial direction X. The two arrays are mutually connected by means of the fastening system in such a way as to be aligned along the axial direction X.

The arrays 3, 4 are presented in FIG. 2 coupled together. Further arrays in addition to the arrays 3, 4 may be present, which are also coupled to a second (free) end of one of the two arrays 3 or 4. The arrays are in this coupled operating state when the optical unit 1 is in operation.

Figure 3:
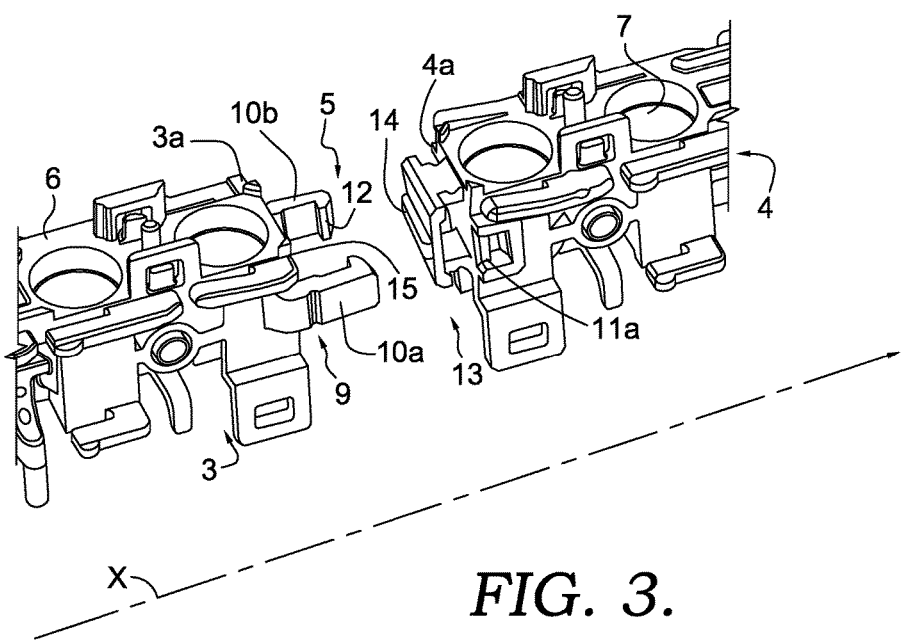
FIGS. 3 and 4 are a perspective view and a side view, respectively, of the first and second decoupled opto-electronic components of FIG. 2.
Figure 4:
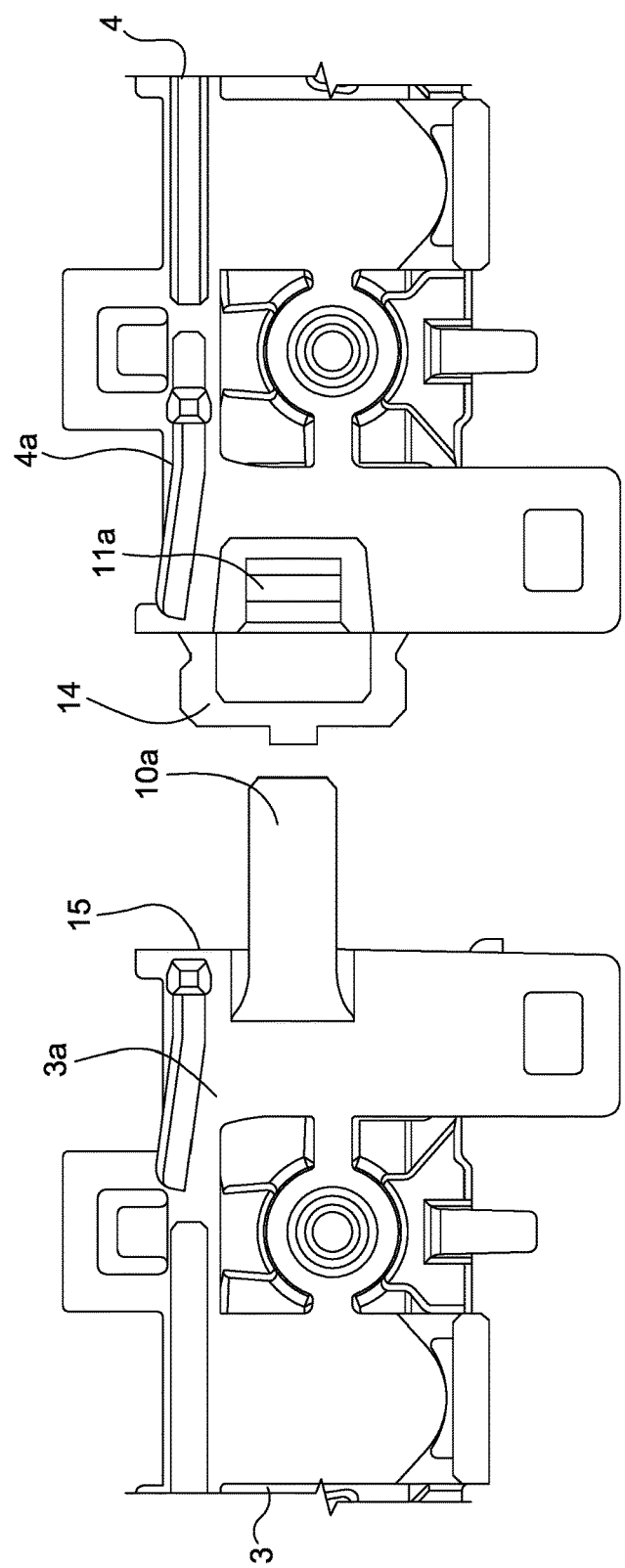
Figure 9:
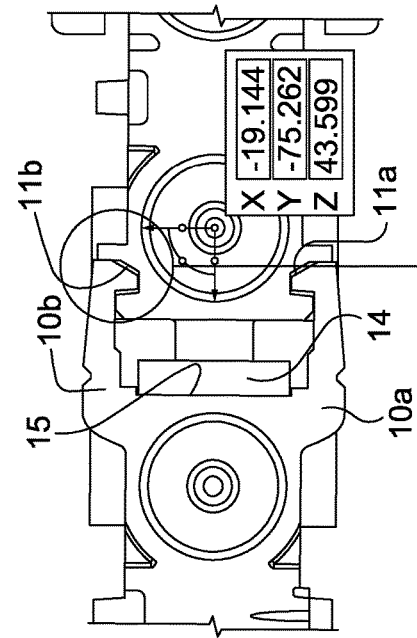
FIGS. 9, 10, 11, 12 are four side views, in different detail, of the first and second opto-electronic components of FIG. 2 in an operative condition at a maximum distance.
Figure 10:
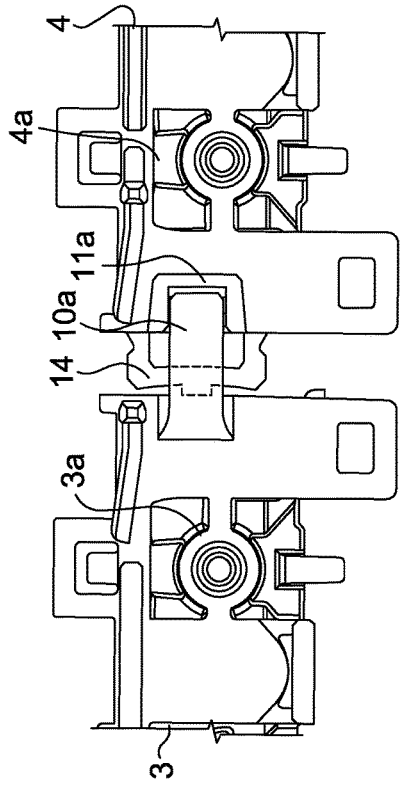
Figure 12:
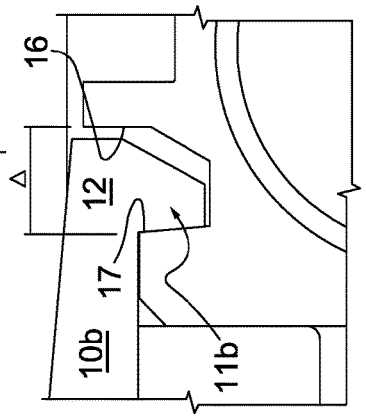
Figure 11:
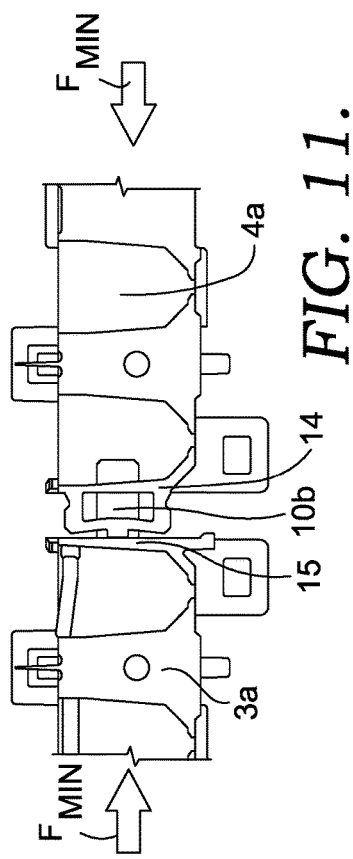

With reference now to FIGS. 3 and 4, the two arrays 3, 4 are decoupled in an operative condition, in which it is the fastening system 5 is most visible. In the decoupled position as in FIGS. 3 and 4, the two arrays 3, 4 are opposite one another, therefore, "in the direction of the first/second array" below indicates the axial direction from the first end 3a (4a) to first end 4a (3a) facing it.

With reference also to FIGS. 5-14, the fastening system 5 includes a mechanical fastening device 9 including in turn a pair of arms 10a, 10b formed as one piece with the plastic body 6 corresponding to the axial end 3a. The two arms protrude from the axial end 3a in the direction of the second array 4. The mechanical fastening device 9 also comprises two seats 11a, 11b formed at the end 4a of the second array 4, each seat being suitable for the introduction within it of a portion of a respective arm 10a, 10b. More preferably, each arm 10a, 10b includes a free final portion 12 which is hook-shaped and suitable for being inserted in the respective seat 11a, 11b.

Each seat 11a, 11b is substantially shaped as a recess within the plastic casing 6 and comprises a first and a second surface facing each other 16, 17. The two surfaces are spaced apart by a given distance Δ along the axial direction and are preferably substantially opposing and facing. The hook 12 is inserted between these two surfaces 16, 17. The distance between the two surfaces is however greater than the dimension along the same direction (axial) of the hook 12, therefore, between the hook and one of the two walls, or between the hook and both walls 16, 17, there can be "play" depending on the insertion position of the hook 12 within its respective seat 11a, 11b (see FIGS. 8, 12 and 14). The location of the seats 11a, 11b at the end 4a and of the arms 10a, 10b at their ends 3a and their length from the end 3a, as well as the value of the distance between the walls 16 and 17 has been selected such that, when the arrays 3, 4 are coupled together, the distance between an optical final chamber 7 defining a final receiving or emitting device of the first array 3 arranged in correspondence with the end 3a and an optical final chamber 7 that defines a final receiving or emitting device of the second array 4 positioned at the end 4a is substantially similar to the pitch between the various transmission/reception devices of the first and/or second array or is slightly different from this.

The fastening device 5 also includes an elastic device 13 that includes a resilient ring 14 which protrudes from the end 4a of the second component 4 in an axial direction towards the first component 3 and a flat surface 15, a portion of the plastics body 6, facing the ring 14. The elastic ring 14 when compressed undergoes a deformation, in particular its extension in the axial direction or protruding from the end 4a is reduced. An elastic force directed in a direction opposite to the direction of deformation and along the same direction is then produced by the ring 14. When the arms 10a, 10b are inserted together with their hooks 12 into the respective seats 11a, 11b (see again FIG. 2), then the ring 14 is in a compressed state, that is to say that the distance between the first and the second ends 3a, 4a when the arms are inserted into the respective seats is less than the dimension along the axial direction of the ring 14 when in an undeformed condition.

If no other force were present, when the array 3 is coupled to the array 4, the elastic force of the ring 14 would push the first end 4a away from the first end 3a, until reaching the maximum extent possible based upon the dimension of the seats 11a, 11b and in particular upon the distance between the walls 16, 17.

In any case there is a force F in the opposite direction to the elastic force. The arrays 3, 4 and any additional arrays are arranged as mentioned within the casing 2. The casing 2 is comprised of one more delimiting walls against which the arrays abut. This abutment in turn generates a compression force F that "compresses" the arrays toward one another and therefore also axially pushes the first end 3a of the first array 3 towards the first end 4a of the second array 4. A balance of forces, elastic and compression, is therefore reached which determines, within the range of possible distances, the final distance between the two arrays 3, 4.

The fastening system 5 can in fact be moved to an operative coupling position at the minimum distance in which the distance between the first end 3a of the first array 3 and the first end 4a of the second array 4 when they are connected together by the fastening system 5 coupled together, is at a minimum within the possible distances for the design of the fastening system. This position is wherein the compressive force Fmax due to the walls of the enclosure 2, against which the ends of the arrays abut, not including the fastening system 5, is particularly high. In this situation, therefore, the elastic force due to the compression of the elastic element 14 is less than the compressive force Fmax and the hook 12 of each arm 10a, 10b abuts against the wall 16 of the respective seat 11a, 11b which is more axially distant with respect to the end 4a. This configuration is represented in FIGS. 5 to 8.

In a different situation, the fastening system can be moved into a coupling operative position at a maximum distance in which the distance between the first end 3a of the first array 3 and the first end 4a of the second array 4 when they are connected together by the fastening system 5 coupled between them is at a maximum within the distances possible for the design of the fastening system. This position is wherein the compressive force Fmin due to the walls of the enclosure 2, against which the ends of the arrays abut, not including the fastening system 5, is particularly low. In this situation, therefore, the elastic force due to the compression of the elastic element 14 is greater than the compressive force Fmin and the hook 12 of each arm 10a, 10b abuts against the wall 17 of the respective seat 11a, 11b which is axially closer with respect to the end 4a. This configuration is represented in FIGS. 9 to 12.

Figure 14:
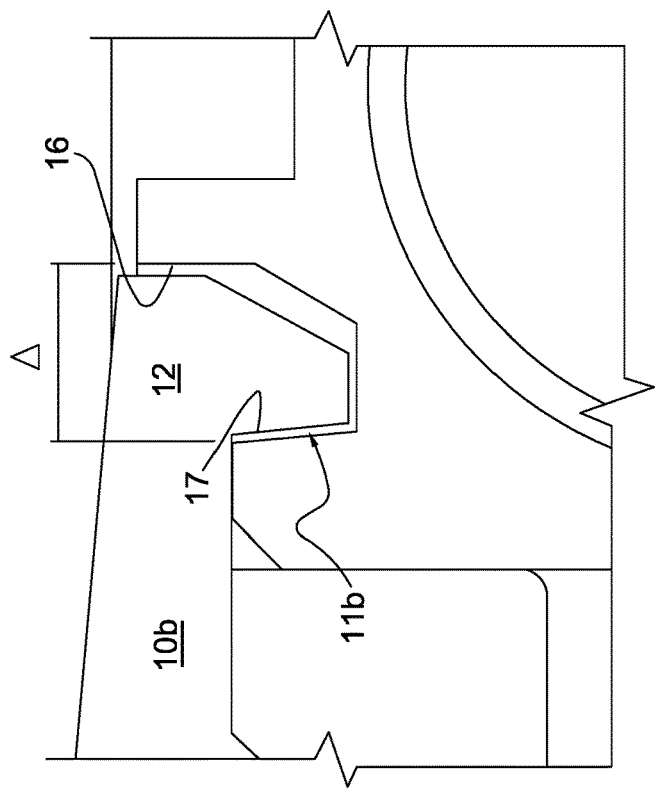
FIGS. 13 and 14 are a perspective view and a side view, respectively, of the first and second opto-electronic components of FIG. 2 in the operating condition at an intermediate distance.
Figure 13:
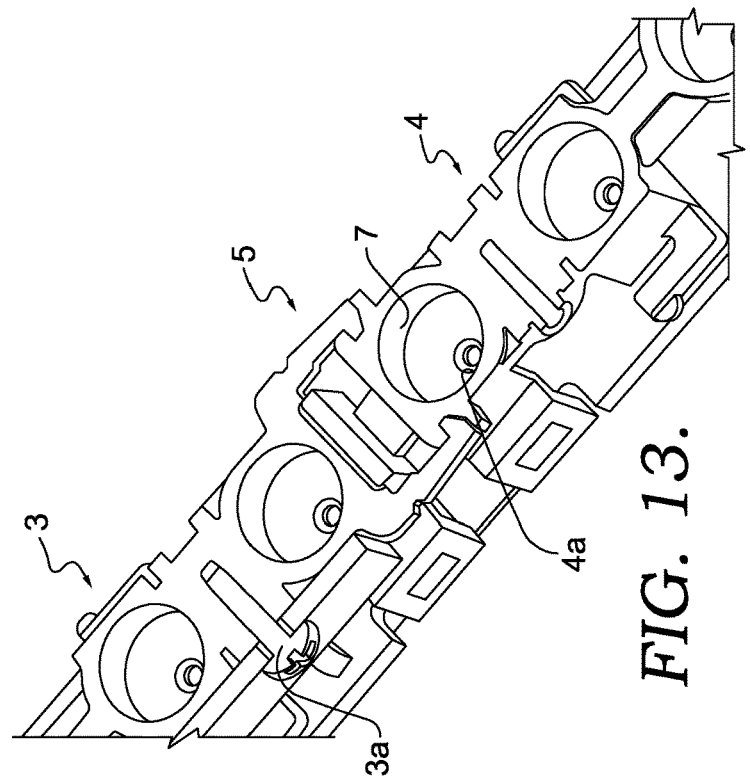

A different balance between the elastic force generated by the elastic ring 14 and the compressive force F can take place and then the hook 12 can be located at any position between the two walls 16 and 17, as shown in FIGS. 13 and 14. The fastening system 5 therefore has an infinite number of possible operational positions within the range determined by the size of the distance Δ that is appropriately selected. In any position within the range Δ there is an elastic force due to the fact that the ring 14 is compressed whenever a portion of the arms 10a, 10b enters their seats 11a, 11b. In this way the play arising from among other things also the distance Δ is recovered by at the same time accepting the different tolerances within the various components and the casing.

Preferably, at the second end which is not visible to both components 3,4 there is a part of a further fastening system 5 for the attachment of the component 3 or 4 of an additional array (again not visible). Therefore, the second end of the first array 3 also has two arms that protrude from the same end and an abutment surface for an elastic ring, while the second end of the second array 4 includes an elastic ring and two seats for the reception of the arms of a further array.

In the case in which arrays 3 or 4—or both—are final arrays, that is to say that if their second end, not illustrated, were to be abutted against one wall of the casing 2, the plastic body 6 of the final array in the second surface would include a rigid fixed wall abutted against the wall of the casing 2 without any further element. In other words, there is no element of the fastening system between a final array and the casing in the abutment of a surface of the second end of the body 6 against a wall of the casing 2.

What is claimed is:

1. An optical unit for an opto-electronic system, said optical unit including:
   a first opto-electronic array and a second opto-electronic array;
   a casing that contains said first opto-electronic array and said second opto-electronic array; and
   a fastening system that connects together said first opto-electronic array and said second opto-electronic array, characterised in that said fastening system is fixed to a first end of said first opto-electronic array and to a first end of said second opto-electronic array and comprises:
an elastic device moveable between an un-deformed operative position and a compressed operative position, wherein the elastic device includes a resilient ring which protrudes from the first end of said second opto-electronic array in the axial direction towards the first end of said first opto-electronic array, wherein the elastic ring undergoes a deformation when compressed, and
a mechanical fastening device that takes said elastic device into said compressed operative position when said mechanical fastening device couples together said first opto-electronic array and said second opto-electronic array, wherein the mechanical fastening device has a pair of inward facing hook-shaped arms such that the pair protrudes from the first end of said first opto-electronic array, wherein the mechanical fastening device has two seats formed at said first end of said second opto-electronic array, and wherein the pair are inserted into the two seats.

2. The optical unit for an opto-electronic system according to claim 1, wherein said elastic device comprises:
an elastic element associated with one of said first end of said first opto-electronic component and said first end of said second opto-electronic component; and
a rigid counter-element associated with the other of said first end of said first opto-electronic component and said first end of said second opto-electronic component, said elastic element abutting against said rigid counter-element.

3. The optical unit for an opto-electronic system according to claim 2, wherein said elastic element is ring shaped and is made from plastic material.

4. The optical unit for an opto-electronic system according to claim 2, wherein said rigid counter-element includes an abutment surface for said elastic element facing and in contact with said elastic element when said first and said second opto-electronic component are connected.

5. The optical unit for an opto-electronic system according to claim 3, wherein said rigid counter-element includes an abutment surface for said elastic element facing and in contact with said elastic element when said first and said second opto-electronic component are connected.

6. The optical unit for an opto-electronic system according to claim 1, wherein said fastening system can slide between a coupled position at minimum distance in which a first distance ($\Delta$) between said first end of said first opto-electronic component and said first end of said second opto-electronic component coupled together is at its minimum, and a coupled operative position at maximum distance in which a second distance ($\Delta$) between said first end of said first opto-electronic component and said first end of said second opto-electronic component coupled together is at its maximum, wherein said at least one seat includes a first abutment surface, and wherein a first surface of said arm abuts when said fastening system is in said coupled position at minimum distance.

7. The optical unit for an opto-electronic system according to claim 6, wherein said at least one seat includes a second abutment surface, wherein a second surface of said arm abuts when said fastening system is in said coupled position at maximum distance.

8. The optical unit for an opto-electronic system according to claim 7, wherein said first and second abutment surface are facing one another and spaced apart by a third distance ($\Delta$) equal to the difference between said minimum distance and said maximum distance.

9. The optical unit for an opto-electronic system according to claim 2, wherein said elastic element associated with one of said first end of said first opto-electronic component and said first end of said second opto-electronic component is made in one piece with said first end and said rigid counter-element associated with the other of said first end of said first opto-electronic component and said first end of said second opto-electronic component is made in one piece with said other first end.

10. The optical unit for an opto-electronic system according to claim 2, wherein said first opto-electronic component includes a first and a second end, said first and said second ends being both associated with said mechanical element and with said rigid counter-element, or said first and second ends being both associated with said mechanical counter-element and with said elastic element.

11. The optical unit for an opto-electronic system according to claim 2, wherein said first opto-electronic component includes a first and a second end, said first end being associated with said mechanical element and with said rigid counter-element and said second end including a rigid flat surface suitable for abutting against said casing, or said first end being associated with said mechanical counter-element and with said elastic element and said second end including a rigid flat surface suitable for abutting against said casing.

12. The optical unit of an opto-electronic system according to claim 1, wherein said first and/or said second opto-electronic device comprises a rigid body moulded in plastic material including said first end.

13. The optical unit of an opto-electronic system according to claim 1, wherein the optical unit is a component in a light barrier.

14. An optical unit for an opto-electronic system, said optical unit including:
a first opto-electronic array and a second opto-electronic array;
a casing that contains said first opto-electronic array and said second opto-electronic array; and
a fastening system that connects together said first opto-electronic array and said second opto-electronic array, characterised in that said fastening system is fixed to a first end of said first opto-electronic array and to a first end of said second opto-electronic array and comprises:
an elastic device moveable between an un-deformed operative position and a compressed operative position, wherein the elastic device includes a resilient ring which protrudes from the first end of said second opto-electronic array in the axial direction towards the first end of said first opto-electronic array, wherein the elastic ring undergoes a deformation when compressed, and
a mechanical fastening device that takes said elastic device into said compressed operative position when said mechanical fastening device couples together said first opto-electronic array and said second opto-electronic array, wherein the mechanical fastening device has a pair of inward facing hook-shaped arms such that the pair protrudes from the first end of said first opto-electronic array, wherein the mechanical fastening device has two seats formed at said first end of said second opto-electronic array, and wherein the pair are inserted into the two seats,
wherein said fastening system can be slid between a coupled position at minimum distance in which a first distance ($\Delta$) between said first end of said first optoelectronic array and said first end of said second opto-electronic array coupled together is at its minimum, and a coupled operative position at maximum distance in which a second distance (Δ) between said first end of said first opto-electronic array and said first end of said second opto-electronic array coupled together is at its maximum.

15. An optical unit for an opto-electronic system, said optical unit including:
   a first opto-electronic array and a second opto-electronic array;
   a casing that contains said first opto-electronic array and said second opto-electronic array; and
   a fastening system that connects together said first opto-electronic array and said second opto-electronic array, characterised in that said fastening system is fixed to a first end of said first opto-electronic array and to a first end of said second opto-electronic array and comprises:
      an elastic device moveable between an un-deformed operative position and a compressed operative position, wherein the elastic device includes a resilient ring which protrudes from the first end of said second opto-electronic array in the axial direction towards the first end of said first opto-electronic array, wherein the elastic ring undergoes a deformation when compressed, and
      a mechanical fastening device that takes said elastic device into said compressed operative position when said mechanical fastening device couples together said first opto-electronic array and said second opto-electronic array, wherein the mechanical fastening device has a pair of inward facing hook-shaped arms such that the pair protrudes from the first end of said first opto-electronic array, wherein the mechanical fastening device has two seats formed at said first end of said second opto-electronic array, and wherein the pair are inserted into the two seats,
   wherein said first and said second opto-electronic array includes receiver elements of electromagnetic radiation or includes emitter elements of electromagnetic radiation.

16. The optical unit of an opto-electronic system according to claim 15, wherein said first and said second opto-electronic array comprises a rigid body moulded in plastic material including said first end.

17. The optical unit of an opto-electronic system according to claim 15, wherein the optical unit is a component in a light barrier.

* * * * *